United States Patent [19]
Sommerer

[11] 4,401,898
[45] Aug. 30, 1983

[54] TEMPERATURE COMPENSATED CIRCUIT

[75] Inventor: Raymond Sommerer, Phoenix, Ariz.

[73] Assignee: Motorola Inc., Schaumburg, Ill.

[21] Appl. No.: 187,310

[22] Filed: Sep. 15, 1980

[51] Int. Cl.[3] .......................... H03K 1/04; G01J 5/00
[52] U.S. Cl. ................................. 307/310; 307/254; 307/351; 307/491
[58] Field of Search ................ 307/351, 310, 491; 330/284, 285, 289, 297

[56] References Cited
U.S. PATENT DOCUMENTS

| | | | |
|---|---|---|---|
| 2,963,659 | 12/1960 | Parris | 307/310 |
| 3,328,705 | 6/1967 | Eubanks | 307/351 |
| 3,392,342 | 7/1968 | Ordower | 330/224 |
| 3,660,694 | 5/1972 | Lucas | 330/297 |
| 3,742,262 | 6/1973 | Ichinohe et al. | 307/310 |
| 3,815,037 | 6/1974 | Wheatley, Jr. | 330/19 |
| 3,862,437 | 1/1975 | Rossell | 307/351 |
| 3,955,108 | 5/1976 | Beck | 307/310 |
| 3,999,125 | 12/1976 | Takeda et al. | 307/351 |
| 4,004,462 | 1/1977 | Dobkin | 307/310 |
| 4,088,963 | 5/1978 | Machida et al. | 330/284 |
| 4,101,841 | 7/1978 | Okada et al. | 330/289 |

Primary Examiner—Stanley D. Miller
Assistant Examiner—B. P. Davis
Attorney, Agent, or Firm—Eugene A. Parsons

[57] ABSTRACT

A temperature-compensated peak detector circuit which includes a diode connected transistor, the base-collector junction of which is connected across an averaging circuit to a second matched transistor in emitter follower configuration. Appropriate resistances are connected to the collector of the diode connected transistor and to the emitter of the other transistor to make equal the collector currents of the two transistors. As a result, the emitters are at approximately equal voltages. Therefore the adjusted peak voltage of the signal always appears at the emitter of the second transistor regardless of changes in ambient temperature.

8 Claims, 1 Drawing Figure

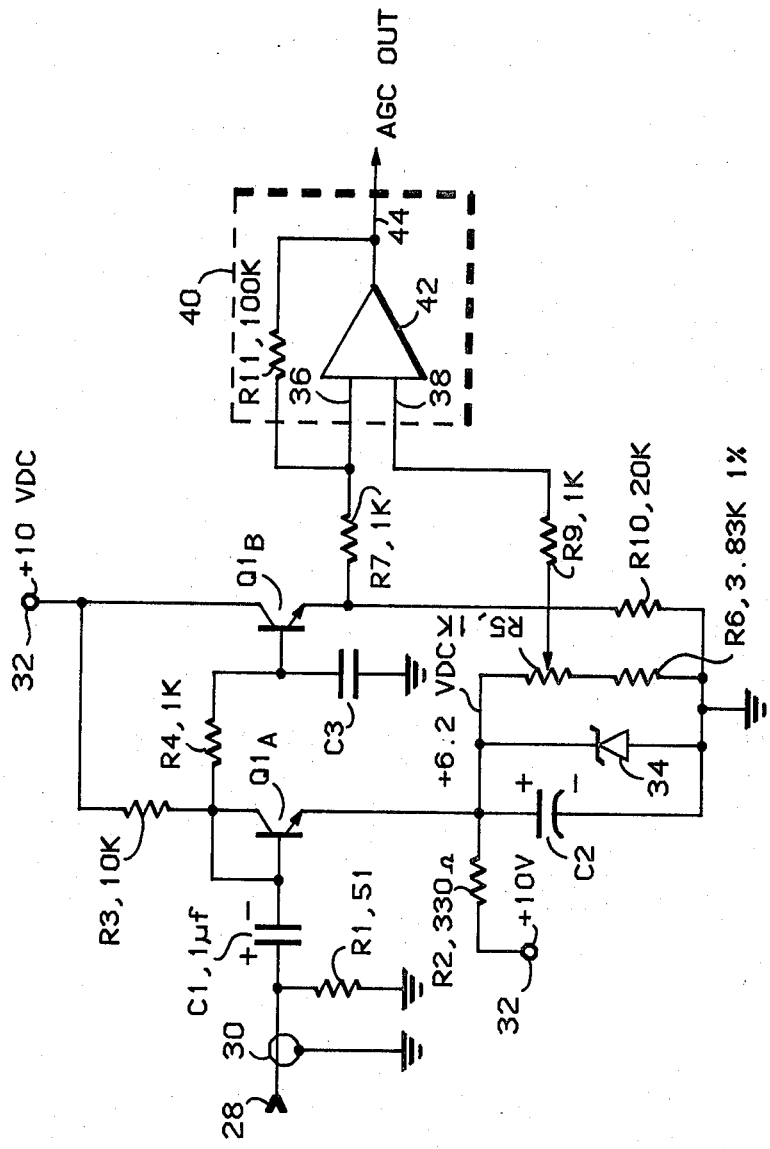

TEMPERATURE COMPENSATED CIRCUIT

BACKGROUND OF THE INVENTION

1. Field of the Invention

The present invention relates to temperature compensated circuits and more particularly to temperature compensated, peak detector circuits.

2. Description of the Prior Art

Temperature compensation circuits often involve the use of a negative-temperature coefficient reverse-biased Zener diode in series with positive-temperature coefficient forward biased diodes. This common approach lacks precision of control.

Another prior art approach to temperature compensation is revealed in U.S. Pat. No. 4,101,841, entitled "Gain Control Circuit", issued July 18, 1978. In that prior art device, a circuit having a temperature dependence opposite to that of the gain control section is used to cancel the temperature dependence of the gain control section. This approach requires complex circuit matching to achieve precise stability.

In one type of prior art device for temperature compensation, typified in U.S. Pat. No. 3,392,342, entitled "Transistor Amplifier With Gain Stability", issued July 9, 1968, matched transistors having their base and collector electrodes connected are connected directly across the base-emitter junctions of one or more matched transistor amplifiers to provide gain stability. This approach involves the use of a current translator to impose one base-emitter voltage on another base-emitter for the purpose of maintaining stability of current gain. Although current gain stability is achieved in the face of temperature change, the collector currents of the input and amplifier transistors are only approximately equal, and, therefore, the device does not produce a value of output voltage equal to the peak value of input voltage, as is desirable in peak detector circuits.

SUMMARY OF THE INVENTION

Accordingly it is an object of the present invention to provide a new and improved peak detector circuit.

It is a further object to provide a new and improved peak detector circuit wherein the peak voltage of the signal input is translated from the base-collector of a first diode connected transistor through the base of a second matched transistor so that it appears at the emitter of the second transistor regardless of changes in ambient temperature.

These and other objects of this invention will become apparent to those skilled in the art upon consideration of the accompanying specification, claims and drawings.

In order to attain the above-mentioned objects, the present invention comprises a temperature compensated, peak detector circuit. The base-collector junction of a diode connected transistor is connected to the base of a second transistor which is matched to the first transistor or fabricated on the same semiconductor chip. The emitters of the two matched transistors are maintained at equal voltages because appropriate resistances are used to set the collector currents of the two transistors at essentially equal levels. An averaging circuit is interposed between the two transistors. When a signal enters the first transistor the peak excursion is clamped, the signal is then averaged, and it finally appears at the emitter of the second transistor at its peak voltage regardless of changes in the ambient temperature.

Among the advantages of the present invention over the prior art are simplicity, improved tracking performance over temperature, and gain isolation of the second transistor.

BRIEF DESCRIPTION OF THE DRAWING

The drawing is a schematic diagram of a device embodying the present invention.

DESCRIPTION OF THE PREFERRED EMBODIMENT

In a preferred embodiment of the peak detector circuit, as illustrated in the drawing, the signal enters at input 28 and is passed through coaxial cable 30, the center conductor of which is connected to ground through resistor R1. The signal is coupled by capacitor C1 to the base of transistor $Q1_A$. The base and collector electrodes of transistor $Q1_A$ are connected, and the base-collector junction thus formed is connected to a source of potential 32 through resistor R3 and to the base of transistor $Q1_B$ through resistor R4. Transistors $Q1_A$ and $Q1_B$ may be matched or fabricated on the same semiconductor chip. Capacitor C3 is connected between the base of transistor $Q1_B$ and ground. The collector of transistor $Q1_B$ is connected to source of potential 32 and its emitter is connected to ground through resistor R10. Although a preferred embodiment employing NPN transistors is described in this specification, it will be understood by those skilled in the art that PNP transistors could be employed if obvious design adjustments are made.

The emitter of transistor $Q1_A$ is connected to a source of potential 32 through resistor R2 and to ground through capacitor C2. In parallel with capacitor C2 are Zener diode 34, and potentiometer R5 and resistor R6 in series. The wiper of potentiometer R5 is connected to input 38 of gain control circuit 40 through resistor R9. The emitter of transistor $Q1_B$ is connected to second input 36 of gain control circuit 40 through resistor R7. The feedback from gain control circuit 40 is also fed into second input 36.

Gain control circuit 40 as shown in the drawing comprises a differential amplifier 42. Output 44 of differential amplifier 42, which serves as the output of gain control circuit 40 is fed back to input 36 through resistor R11. In the exemplary device, as shown in the drawing, differential amplifier 42 is an operational amplifier. Other methods of gain control could be devised by those skilled in the art and are intended to come within the scope of this invention, as claimed.

In operation, an input signal is applied to input terminal 28 and passes through capacitor C1. The emitter of transistor $Q1_A$ is set at a level of positive voltage determined by the action of Zener diode 34. Capacitor C2 acts to smooth out fluctuations in the emitter voltage of transistor Q1A. Due to diode clamping action, the peak positive excursion of the input signal is clamped at a value above the emitter voltage of transistor $Q1_A$. A signal passing through transistor $Q1_A$ is averaged by the circuit comprising resistor R4 and capacitor C3, with the value of capacitor C3 being selected for passing high frequency components of the signal to ground. It will be understood that other types of averaging circuits could be devised by those skilled in the art without affecting the essential features and function of the present invention. Transistors $Q1_A$ and $Q1_B$ are a matched pair; the base-emitter voltage drops in each case are equal if the collector currents are held equal. Therefore, the peak positive excursion of the input signal above the emitter of $Q1_A$ should equal the base-emitter voltage drop of the emitter follower transistor $Q1_B$ if the collector current of transistor $Q1_A$ is equal to the collector current of transistor $Q1_B$.

The collector current of transistor $Q1_A$ is set by $R_3$ and $V_{R3}$, the voltage across R3. The collector current of transistor $Q1_B$ is set by $R_{10}$, $V_{R10}$ (the voltage drop across R10), $R_7$ and $V_{R7}$ (the voltage drop across R7). At the balance point of gain control circuit 40 there is essentially no current through $R_7$ because the wiper voltage of potentiometer R5 and the emitter voltage of $Q1_B$ will be identical. Therefore, the collector current of transistor $Q1_B$ will be set by resistor R10. The values of resistors R3 and R10 can be chosen to set the average collector current of transistor $Q1_B$ essentially equal to the average collector current of transistor $Q1_A$. This means that the peak voltage of the signal input will appear at the emitter of $Q1_B$ regardless of changes in ambient temperature.

For example, a device has been constructed with values for components as indicated in the drawing. The peak positive excursion of the signal is clamped at approximately +0.65 V above the emitter of transistor $Q1_A$ by the base-emitter voltage drop. The emitter of $Q1_A$ is set by Zener diode 34 at +6.2 V DC. The collector current of transistor $Q1_A$ is set by R3 and $V_{R3}$ ($V_{R3} = 10$ V $-0.65$ V $-6.2$ V $= 3.15$ V, R3=10K; $3.15/10K = I_{R3} = 315$ µA). Because transistor $Q1_B$ is an emitter follower matched to transistor $Q1_A$, the voltage appearing at its emitter is approximately 0.65 V down from its base voltage. The collector current of transistor $Q1_B$ is set by R10, $V_{R10}$, R7 and $V_{R7}$ ($V_{R10}=6.2$ V, R10=20K; $6.2/20K=I_{R10}=310$ µA). At the balance point of the control voltage network, the center wiper voltage of potentiometer R8 will equal the emitter voltage of transistor $Q1_B$ so that no current will flow through R7 ($I_{R7}=0$). Therefore, 310 µA of current flows through the collector of transistor $Q1_B$, an amount nearly equal to the 315 µa flow in the collector of $Q1_A$. Under these conditions the peak voltage of the signal will appear at the emitter of transistor $Q1_B$ regardless of ambient temperature changes. For example, a 0.2 V peak to peak signal will generate a DC voltage at the emitter of transistor $Q1_B$ of +6.1 V DC (+6.2 V $-0.1$ V). For a desired peak signal of 0.1 V, the wiper of potentiometer R5 would be set to +6.1 V DC.

While the present invention has been described in terms of a preferred embodiment, further modifications and improvements will occur to those skilled in the art. I desire it to be understood, therefore, that this invention is not limited to the particular form shown, and I intend in the appended claims to cover all modifications which do not depart from the spirit and scope of this invention.

What is claimed is:

1. A temperature stabilized circuit comprising:
   (a) circuit means for accepting an input signal;
   (b) means for establishing a reference voltage comprising a zener diode;
   (c) a first means for controlling a first current, said first means comprising a first semiconductor, said first semiconductor comprising a plurality of electrodes, said plurality of electrodes being connected in diode configuration, said first means being provided with a reference voltage by said means for establishing a reference voltage, said reference voltage determining a base level of current through said first semiconductor, and said first semiconductor being responsive to a signal from said circuit means;
   (d) a coupling circuit responsive to a signal from said first semiconductor;
   (e) second means for controlling a second current to be substantially equal to said first current, said means for controlling second current comprising a second semiconductor, said second semiconductor comprising a plurality of electrodes connected in emitter follower configuration, said second semiconductor having at least one temperature characteristic matched to at least one temperature characteristic of said first semiconductor, and said second semiconductor being coupled to said first semiconductor by said coupling circuit;
   (f) an output circuit responsive to a signal from said second semiconductor; and
   (g) means for applying power to the temperature stabilized circuit.

2. The circuit according to claim 1 wherein said means for establishing a reference voltage further comprises means for smoothing out fluctuations in said means for applying power.

3. The circuit according to claim 2 wherein said means for smoothing out fluctuations in said means for applying power comprises a capacitor, said capacitor being connected in parallel with said Zener diode.

4. The circuit according to claim 1 wherein said coupling circuit comprises means for averaging a signal from said first means.

5. The circuit according to claim 4 wherein said means for averaging a signal comprises:
   a resistor, said resistor being connected between at least one of said plurality of electrodes of said first semiconductor and one of said plurality of electrodes of said second semiconductor; and
   a capacitor connected between said one of said plurality of electrodes of said second semiconductor and said means for applying power.

6. The circuit according to claim 1 wherein at least said first means and said second means are fabricated on a single semiconductor chip.

7. The circuit according to claim 1 wherein said output circuit comprises a means for providing at least one automatic gain control signal.

8. The circuit according to claim 7 wherein said means for providing at least one automatic gain control signal comprises:
   at least one differential amplifier; and
   voltage divider means for setting a comparator voltage on said at least one differential amplifier, said voltage divider means being connected between said at least one differential amplifier and said means for establishing a reference voltage.

* * * * *